United States Patent [19]
Lee et al.

[11] Patent Number: 5,920,504
[45] Date of Patent: Jul. 6, 1999

[54] SEMICONDUCTOR MEMORY HAVING EMBEDDING LOCKABLE CELLS

[75] Inventors: Seung-Keun Lee, Sungnam-shi; Jin-Seon Yeom, Suwon-shi, both of Rep. of Korea

[73] Assignee: Samsung Electronics Co., Ltd., Suwon, Rep. of Korea

[21] Appl. No.: 08/928,488

[22] Filed: Sep. 12, 1997

[30] Foreign Application Priority Data

Sep. 13, 1996 [KR] Rep. of Korea ................. 96-39903

[51] Int. Cl.$^6$ .................................................. G11C 16/04
[52] U.S. Cl. ............... 365/185.11; 711/170; 365/185.13; 365/185.29; 365/230.03
[58] Field of Search ................ 365/185.11, 185.25, 365/6.3, 185.13, 185.29, 185.3, 230.03; 711/170

[56] References Cited

U.S. PATENT DOCUMENTS 5,515,319  5/1996  Smayling et al. ............ 365/185.25
5,737,258  4/1998  Choi et al. ...................... 365/63
5,809,553  9/1998  Choi et al. ...................... 711/170

*Primary Examiner*—David Nelms
*Assistant Examiner*—Thong Le
*Attorney, Agent, or Firm*—Jones Volentine, L.L.P.

[57] ABSTRACT

A semiconductor memory is disclosed having lockable cells which can be programmed or erased to store the information of an erasure lock or an erasure unlock without disturbing data stored in memory cells. The memory includes a memory cell array formed of a plurality of blocks, the blocks formed of a plurality of memory cells which are coupled to a plurality of memory word lines and bit lines, a lockable cell array formed of a plurality of lockable cells which are coupled to a lockable bit line and a plurality of lockable word lines which are electrically isolated from the memory word lines, and a lockable decoding circuit to generate a plurality of decoding signals to select the lockable word lines independent upon a selection of the memory word lines.

2 Claims, 8 Drawing Sheets

SEMICONDUCTOR MEMORY HAVING EMBEDDING LOCKABLE CELLS

BACKGROUND OF THE INVENTION

The invention relates to semiconductor memories and more particularly to a nonvolatile dynamic memory having lockable cells.

It is well known that an important consideration for nonvolatile memories is that they be able to conserve data even when there is no power supply. Typically, in a flash EEPROM nonvolatile memory, data written into memory cells must be held in the memory cells until an erasure operation is performed to remove the data. However, it is inevitable that the memory will be affected by unpredictable variations such as the fluctuation of its power source voltage or other influences from the external environment. These influences can reduce the stability of the data storage and may even result in the undesirable erasure of data stored in the memory cells. In order to avoid such malfunctions, an additional solution called "erasure lock" has been employed in EEPROMs. Under an erasure lock design, a plurality of lockable cells are arranged correspondent to the word lines of a memory cell array, and control gates of the lockable cells belonging to one page are coupled to each other in common. These lockable cells retain information of either the erasure lock or the erasure unlock.

FIG. 1 shows a schematic of a conventional nonvolatile memory having lockable cells corresponding to one page of a normal memory cell array. The nonvolatile memory comprises an memory cell array 1, a lockable cell array 2, an input output buffer 3, a command control circuit 4, a lock control circuit 5, a controller 6, a voltage control circuit 7, first and second page buffers 8a and 8b, and a detection buffer 9.

The memory cell array 1 (one page) and the lockable cell array are both formed of NAND-typed cell strings and lockable cell array 2 formed of a NAND-typed cell string. A string selection line SSL is coupled to the gates of string selection transistors $MS_1$ through $MS_1$ in the memory cell array 1, and is also connected to gate of string selection transistor $MLS_1$ in the lockable cell array 2. A ground selection line GSL is coupled to the gates of ground selection transistors of the memory cell array 1 and the lockable cell array 2. Word lines $WL_1$ to $WL_8$ are coupled to the control gates of memory cells $MC_1$ through $MC_8$ and of lockable cells $MLC_1$ through $MLC_8$. The word lines $WL_1$ to $WL_8$ are connected to the outputs of the voltage control circuit 7, which is operated in response to the output of the controller 6. The controller 6 receives information on the state of the voltage level on lockable bit line LBL through the detection buffer 9.

If an address and a command signal for the erasure lock operation are supplied from outside of the nonvolatile external through input/output buffer 3, the command control circuit 4 activates the lock control circuit 5, and then controller 6 lets voltage control circuit 7 be conducted. By applying a read voltage generated from the voltage control circuit 7 to the word lines, the detected voltage levels on the bit lines of the memory cell array 1 and the lockable cell array 2 are stored in first and second page buffers 8a and 8b and in the detection buffer 9. After these voltage levels are stored, the lock control circuit 4 reads the information held at detection buffer 9 and determines whether a selected lockable cell is an on-cell or an off-cell. If the selected lockable cell (e.g., $MLC_1$) is an on-cell, it indicates that the page is in the state of erasure unlock, which allows for programming of the page. However, if the selected lockable cell is an off-cell, it indicates that the page in the state of erasure lock.

If the information from the lockable cell array denotes that a page is in a state of erasure unlock, certain operations are performed prior to programming the memory cells of the memory cell array 1 associated with the page, and the lockable cells of the related lockable cell array 2. Data stored in the memory cells and lockable cells of the page to be locked are first transformed to a subsidiary memory region and then all of the cells are completely erased. Thereafter the lockable cells are programmed to become off-cells as of erasure lock state and next the memory cells are programmed with the data temporally stored in the subsidiary memory region. Any page selected to be locked must be put into an erasure mode before programming. Also in the case of converting a locked page to an unlocked page, after data stored in memory cells of a page selected to be unlocked are moved to the subsidiary memory region and then all of the memory cells and lockable cells are erased, the memory cells of the page to be unlocked are programmed with the original data stored in the subsidiary memory region. As described above, the processing manner for the erasure lock in FIG. 1 has a disadvantage in that the erasure operation against the memory cells and lockable cells of the page selected is an essential step prior to programming. This reduces the efficiency for the entire operation as well as for the erasure lock.

SUMMARY OF THE INVENTION

Accordingly, it is an object of the invention to provide a semiconductor memory capable of accomplishing an efficient erasure lock operation.

Another object of the invention is to provide a semiconductor memory available for carrying out an efficient erasure lock operation without disturbing the states of memory cells.

Further object of the invention is to provide a semiconductor memory making memory cells be independent on an erasure lock operation against lockable cells.

In order to accomplish those objects, the semiconductor memory of the invention includes a memory cell array formed of a plurality of blocks formed of a plurality of memory cells which are coupled to a plurality of memory word lines and bit lines, a lockable cell array formed of a plurality of lockable cells which are coupled to a lockable bit line and a plurality of lockable word lines which are electrically isolated from the memory word lines, and a lockable decoding circuit to generate a plurality of decoding signals to select the lockable word lines independent upon a selection of the memory word lines.

Lockable cells can be programmed or erased to store the information of an erasure lock or an erasure unlock without disturbing data stored in memory cells. It can be easily interchanged between the states of the erasure lock and unlock without disturbing data of memory cells even after a program operation for the memory cells.

DETAILED DESCRIPTION OF THE PREFERRED EMBODIMENTS

Figure 1:
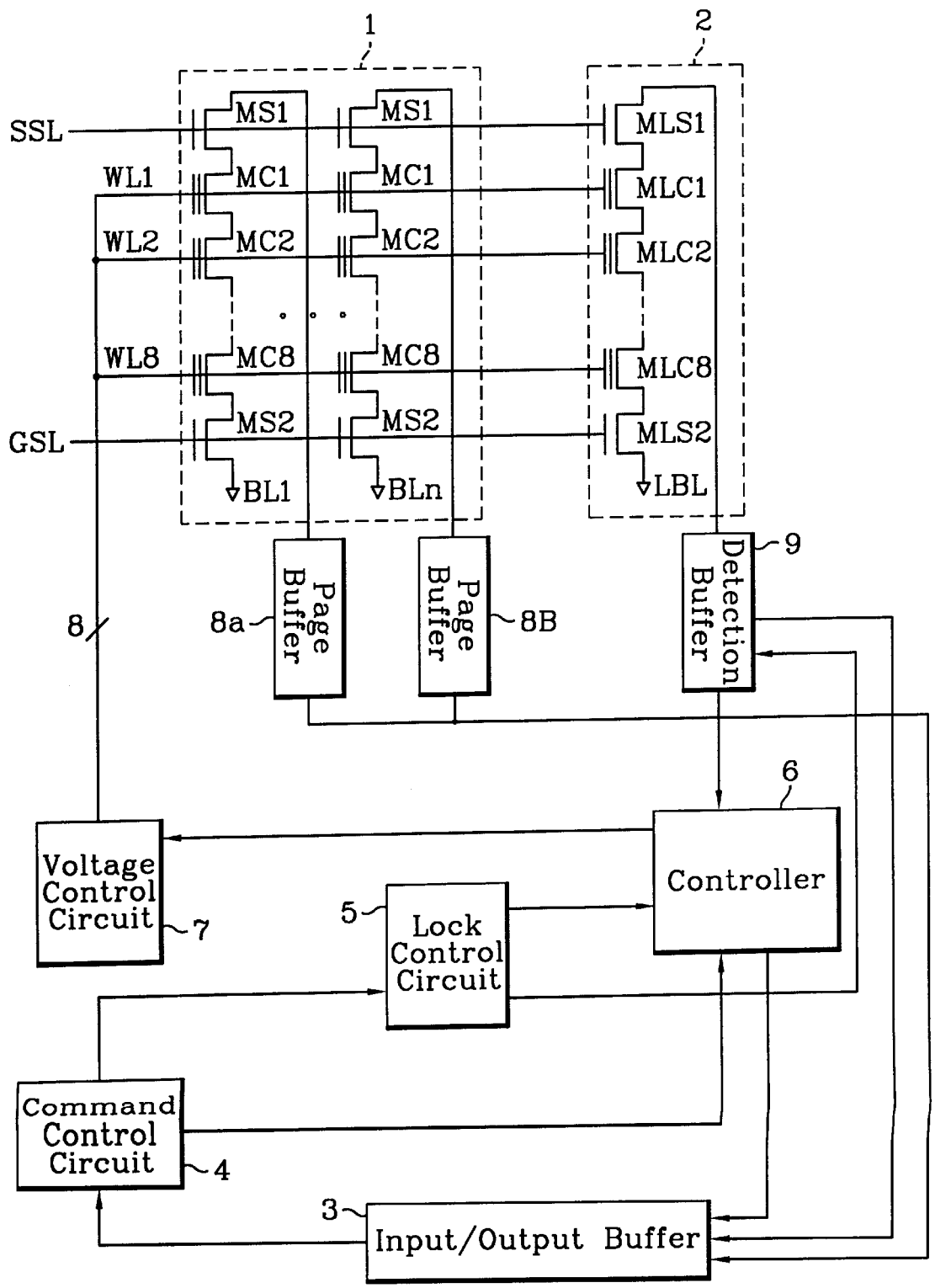
FIG. 1 shows a schematic of a conventional nonvolatile memory having lockable cells corresponding to one page of a normal memory cell array.

Applicable embodiments of the invention will be described as follows, with reference to the appended drawings. In the drawings, like reference characters designate like or corresponding parts throughout the several views. The suffix "B" of a signal name denotes that the signal activates on negative logic.

Figure 2:
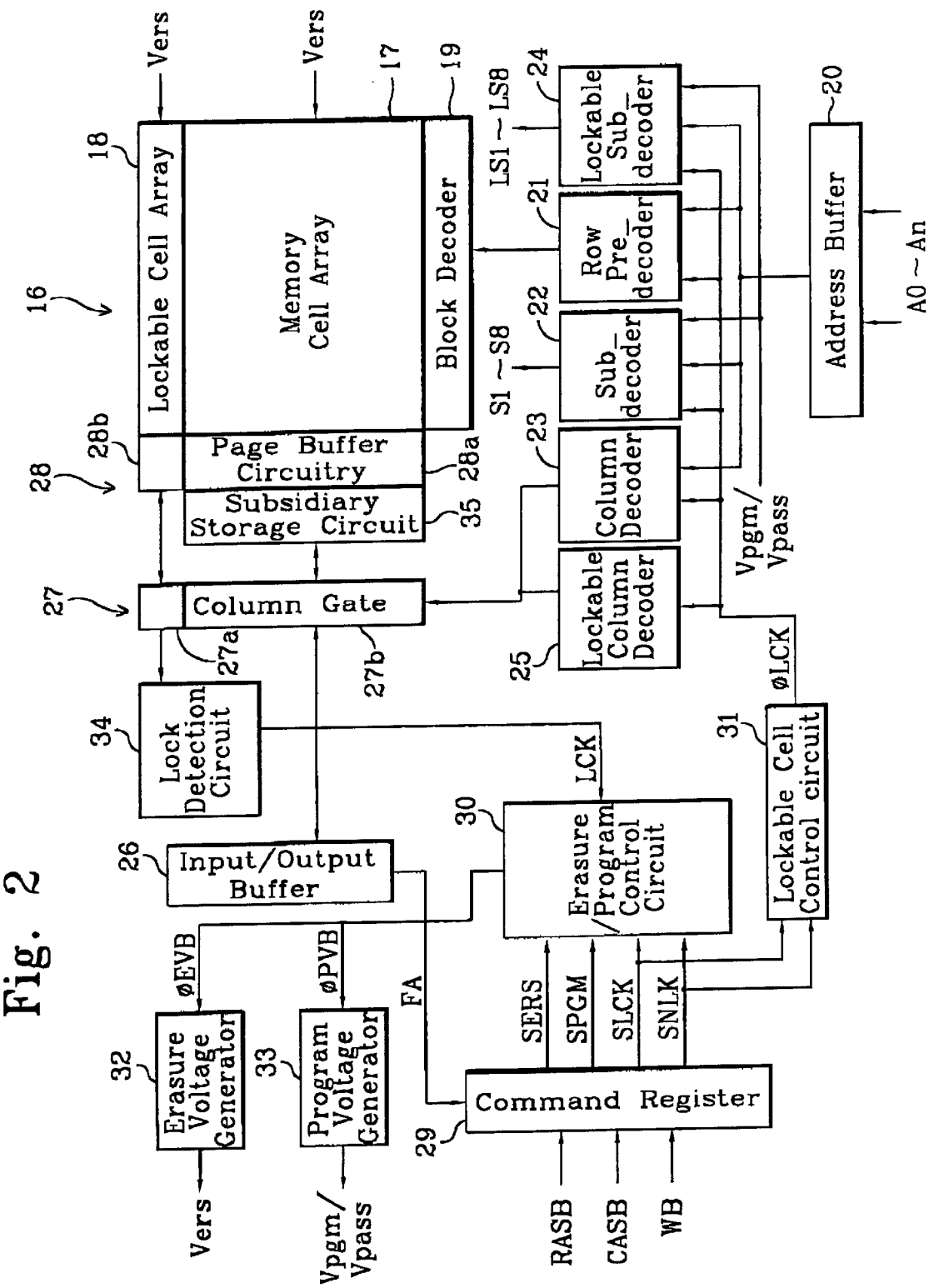
FIG. 2 is a block diagram of a nonvolatile memory according to a preferred embodiment of the present invention.

FIG. 2 is a block diagram of a nonvolatile memory according to a preferred embodiment of the present invention. The nonvolatile memory comprises a memory unit 16, an address buffer 20, a row pre-decoder 21 a sub-decoder 22, a column decoder 23, a lockable sub-decoder 24, a lockable column decoder 25, column gate circuitry 27, divided into a first column gate 27a and a second column gate 27b, a command register 29, an erasure/program control circuit 30, a lockable cell control circuit 31, an erasure voltage generator 32, a program voltage generator 33, and a lock detection circuit 34. The memory unit 16 comprises a memory cell array 17, a lockable cell array 18, a block decoder 19, page buffer circuitry divided into first and second page buffers 28a and 28b, and a subsidiary storage circuit 35.

As shown in FIG. 2, the a lockable cell array 18 is along side the memory cell array 17. A block decoder 19, formed of plural row decoders, is provided to select blocks defining units to be involved in an erasure lock operation. These blocks include memory cells and lockable cells. The page buffer circuitry 28, formed of a first page buffer 28a for the memory cell array 17 and a second page buffer 28b for the lockable cell array 18, is positioned at a side of the array region. The subsidiary storage circuit 35 is provided between the first page buffer 28a and the first column gate 27a, and is used for temporally storing data of memory cell array 17 during an erasure operation.

The column gate circuitry 27 comprises first column gate 27a for the memory cell array 17 and second column gate 27b for the lockable cell array 18. Through the first column gate 27a, an information about the erasure lock from lockable cell array 18 is transferred to the lock detection circuit 34 and vice versa. The first column gate 27a is connected to the input/output buffer 26, which transmits a command signal FA to the command register 29. The lock detection circuit 34 applies a lock information signal LCK to the erasure/program control circuit 30 in response to the state of a lockable cell selected in lockable cell array 18. The erasure/program control circuit 30 receives an erasure flag signal SERS, a program flag signal SPGM, a lock flag signal SLCK, and an unlock flag signal SNLK from the command register 29 and generates an erasure voltage drive signal ΦEVB or a program voltage drive signal ΦPVB in response to the state of its input signals. ΦEVB makes the erasure voltage generator 32 generate an erasure voltage $V_{ers}$ of about 20V. ΦPVB makes the program voltage generator 33 generate a program voltage $V_{pgm}$ of 18V and a pass voltage $V_{pass}$ of about 8V. $V_{ers}$ is applied to the bulk of the memory and lockable cells during an erasure operation. Control signals, row address strobe signal RASB, column address strobe signal CASB, and write enable signal WB, are all applied to the command register 29. Those control signals are used in a nonvolatile random access memory mode (or a DRAM-interfaced flash memory mode). The lock and unlock flag signals, SLCK and SNCK, are also applied to the lockable cell control circuit 31 so that it can generate the lock control signal ΦLCK. The lock control signal ΦLCK is then applied in common to the lockable column decoder 25, the column decoder 23, the memory sub-decoder 22, the row pre-decoder 21 and the lockable sub-decoder 24.

Address signals $A_0$ through $A_n$ are applied to the column decoder 23, the memory sub-decoder 22, the row pre-decoder 21, and the lockable sub-decoder 24 through the address buffer 20. The program and pass voltages, $V_{pgm}$ and $V_{pass}$, are simultaneously applied to the memory sub-decoder 22 and the lockable sub-decoder 24. Decoding signals generated from the lockable column decoder 25 and the column decoder 23 are applied to the column gate circuitry 27. Memory sub-decoding signals $S_1$ to $S_8$ and lockable sub-decoding signals $LS_1$ to $LS_8$, generated respectively from the memory sub-decoder 22 and the lockable sub-decoder 24, are applied respectively to the memory cell array 17 and the lockable cell array 18. These sub-decoding signals select a page in the memory and lockable cell arrays. The row pre-decoding signals from row pre-decoder 21 are applied to block decoder 19.

The page buffer circuitry 28 is formed of a plurality of latches and sense amplifiers. Each of the flag signals SERS, SPGM, SLCK, and SNLK, generated from the command register 29 is alternatively activated corresponding to a combination state of the command signal (e.g., FA). The command register stores the preliminary generated flag signals until a new command signal appears.

Figure 3:
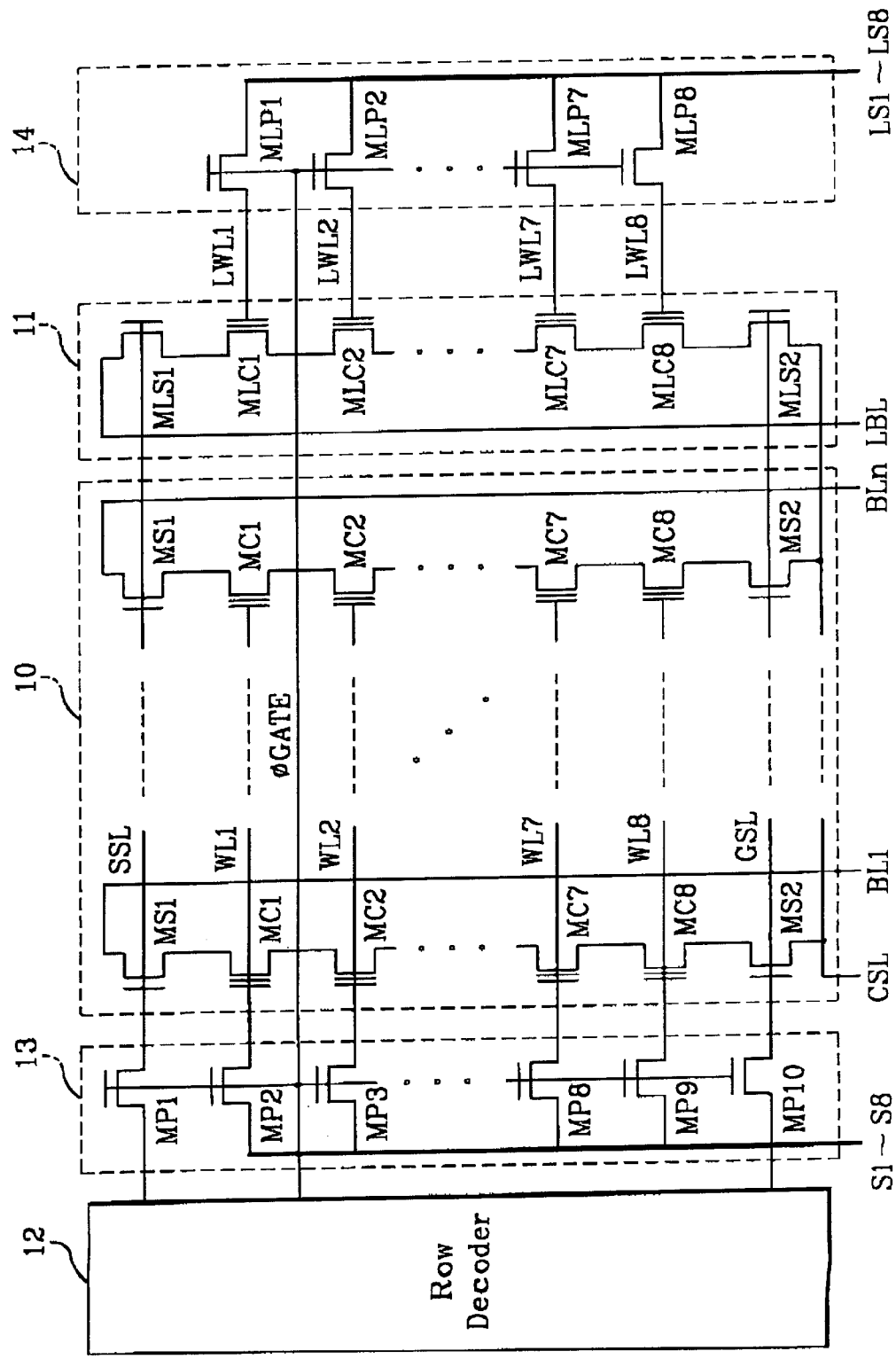
FIG. 3 is a schematic view illustrating an interconnection feature with memory cells and lockable cells in the memory cell array and lockable cell array of FIG. 2.

FIG. 3 is a schematic view illustrating an interconnection feature with memory cells and lockable cells in the memory cell array and lockable cell array of FIG. 2. The interconnection feature is illustrated by a memory cell block 10, a lockable cell block 11, a row decoder 12, a first pass gate array 13, and a second pass gate array 14. The row decoder 12 is embedded in the block decoder 19 of FIG. 2. The first pass gate array 13 is associated with the memory cell block 10 and the second pass gate array 14 is associated with the lockable cell block 11

As shown in FIG. 3, one block is selected by the row decoder 12. The selected block includes the first and second pass gate arrays 13 and 14. The block may be sectionalized into pages which correspond to word lines, where cells coupled to a word line form the page. In memory cell block 10, bit lines $BL_1$ to $BL_N$ are coupled to cell strings each constructed of string selection transistor $MS_1$, memory cells $MC_1$ to $MC_8$ and ground selection transistor $MS_2$. The lockable cell block 11 comprises a cell string constructed of lockable string selection transistor $MLS_1$, lockable cells $MLC_1$ to $MLC_8$ and lockable ground selection transistor $MLS_2$. The pass gate array 13 comprises pass transistors $MP_1$ to $MP_{10}$ arranged to correspond with string and ground selection lines, SSL and GSL, and word lines $WL_1$ to $WL_8$. The transistor $MP_1$ is interposed between row decoder 12 and string selection line SSL, and $MP_{10}$ between row decoder 12 and ground selection line GSL. Transistors $MP_2$ through $MP_9$ interconnect the decoding signals $S_1$ through $S_8$ and word lines $WL_1$ through $WL_8$ with each other. The pass gate array 14 comprises pass transistors $MLP_1$ to $MLP_8$ respectively interposed between lockable word lines $LWL_1$ to $LWL_8$ and decoding signals $LS_1$ to $LS_8$ generated from the lockable sub-decoder 24 of FIG. 2. The gates of pass transistors $MP_1$ to $MP_{10}$ and $MLP_1$ to $MLP_8$ are coupled to block gating signal ΦGATE generated from the row decoder 12. It should be noted, in the construction of FIG. 3, that lockable cells are selected by means of a switching operation with pass gate array 14 that is independent upon that for memory cells.

Figure 4:
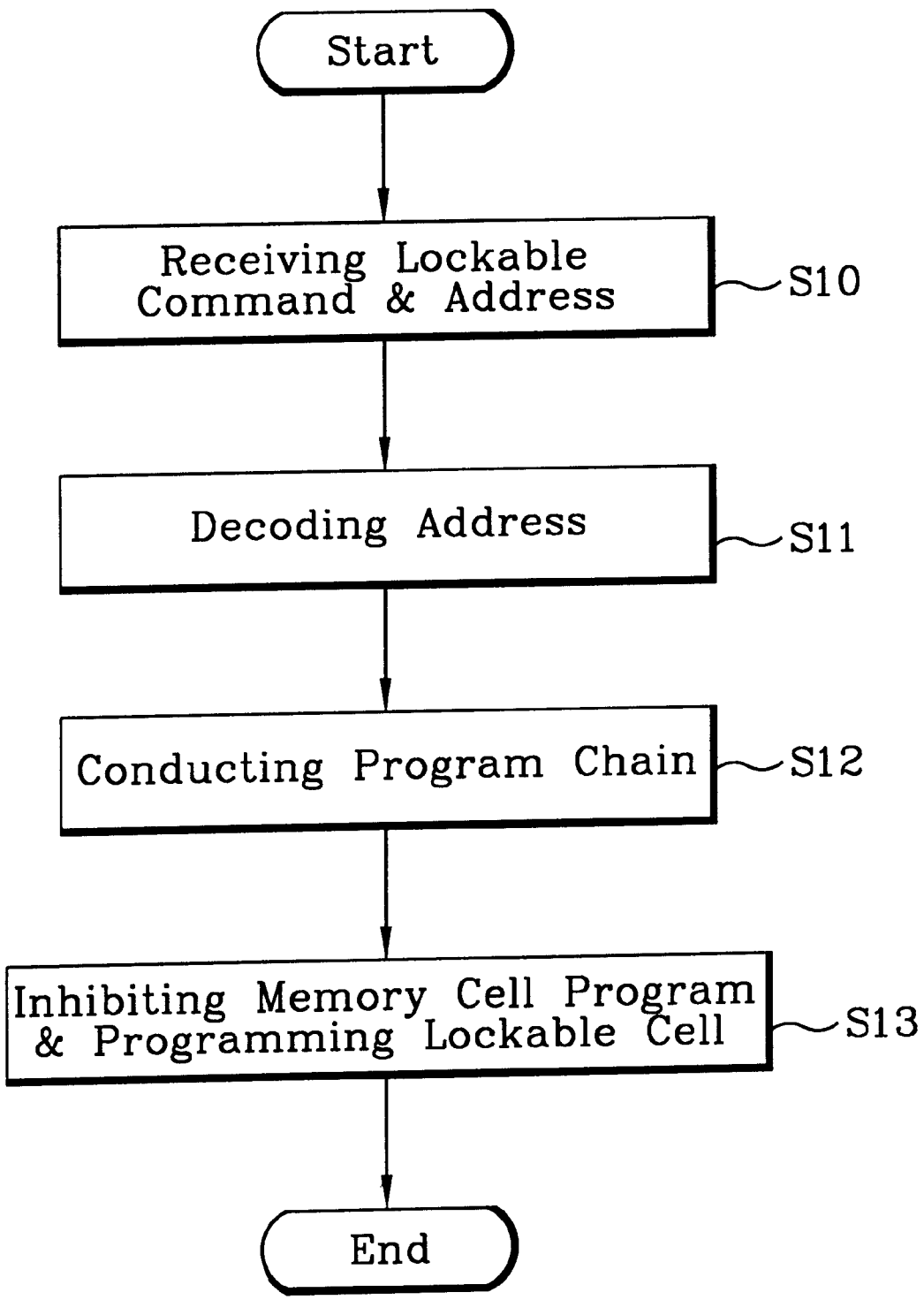
FIG. 4 is a flow chart showing a sequence of converting a lockable cell of a selected page to a locked cell by programming.
Figure 5:
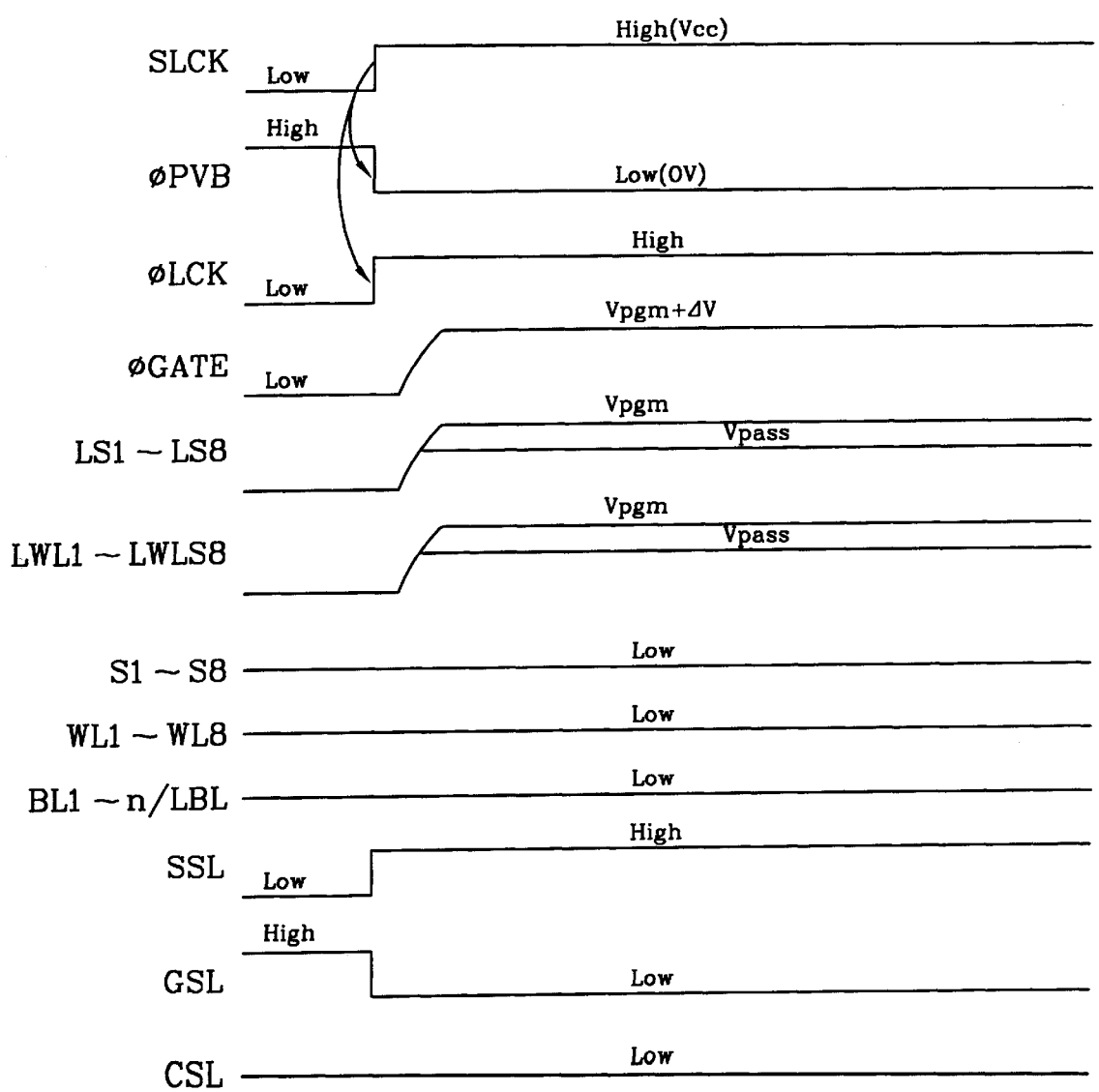
FIG. 5 is a timing diagram of programming a lockable cell according to the sequence of FIG. 4.

FIG. 4 is a flow chart showing a sequence of converting a lockable cell of a selected page to a locked cell by programming. FIG. 5 is a timing diagram of programming a lockable cell according to the sequence of FIG. 4. In a programming mode for setting a lockable cell into the state of erasure lock, shown in FIGS. 4 and 5, a command signal FA and address signals $A_0$ to $A_n$ are supplied from the input/output buffer 26 and from the address buffer 20 (step S10). Afterwards, the address is decoded into the information for selecting a block and a page to be locked (S11). Since the command signal is for the erasure lock, the command register 29 pulls the lock flag signal SLCK up to high level as shown in FIG. 5, causing the erasure/program control circuit 30 to activate its program chain (S12). Then, the program voltage $V_{pgm}$ of about 18V is generated in response to the program voltage drive signal ΦPVB of low level and is applied to the memory sub-decoder 22 and the lockable sub-decoder 24.

Next, the programming of a lockable cell starts at step S13. FIG. 5 illustrates the sequential flow in step S13. As shown in FIGS. 2, 3, and 5, the lockable control signal ΦLCK goes to a high level by the lock flag signal SLCK of high level, pulling down to ground level the sub-decoding signals $S_1$ to $S_8$, used for selecting pages of memory cell array 17. This also raises one of the sub-decoding signals $LS_1$ to $LS_8$, used for selecting pages of lockable cell array 18, to rise to the level of the program voltage $V_{pgm}$. Assuming that $LS_8$ is selected, other sub-decoding signals $LS_1$ to $LS_7$ have the level of the pass voltage $V_{pass}$ while the sub-decoding signal $LS_8$ is set to $V_{pgm}$. While this is being done, the block gating signals ΦGATE is pulled up to the voltage $V_{pgm}+\Delta V$, higher than $V_{pgm}$, and is applied to the gates of lockable pass transistors $MLP_1$ to $MLP_8$ as well as to the gates of memory pass transistors $MP_1$ to $MP_{10}$. This has the effect of transferring $V_{pgm}$ to a corresponding lockable cell, e.g., $MLC_8$. Because $S_1$ to $S_8$ are set to a low level, the memory word lines $WL_1$ to $WL_8$ also retain a low level. However, the lockable word lines $LWL_1$ to $LWL_8$ are subjected to the states of $LS_1$ to $LS_8$. For example, if the lockable cell $MLC_8$ is selected to be locked, $LWL_8$ is set at $V_{pgm}$ while $LWL_1$ to $LWL_7$ are set at $V_{pass}$. Memory bit lines $BL_1$ to $BL_n$ and lockable bit line LBL are held at low level by setting ΦLCK, which protects the memory cells from programming with data from external sources. In other words, the states of the memory cells do not vary even while programming against the lockable cell is being carried out.

With respect to the selected lockable cell $MLC_8$, $V_{pgm}$ is applied to the control gate and the ground voltage of a low level is applied to the lockable bit line LBL and common source line CL. As a result of this, electrons are charged in the floating gate and so the threshold voltage rises to cause off-cell storing of the information of the erasure lock.

Figure 6:
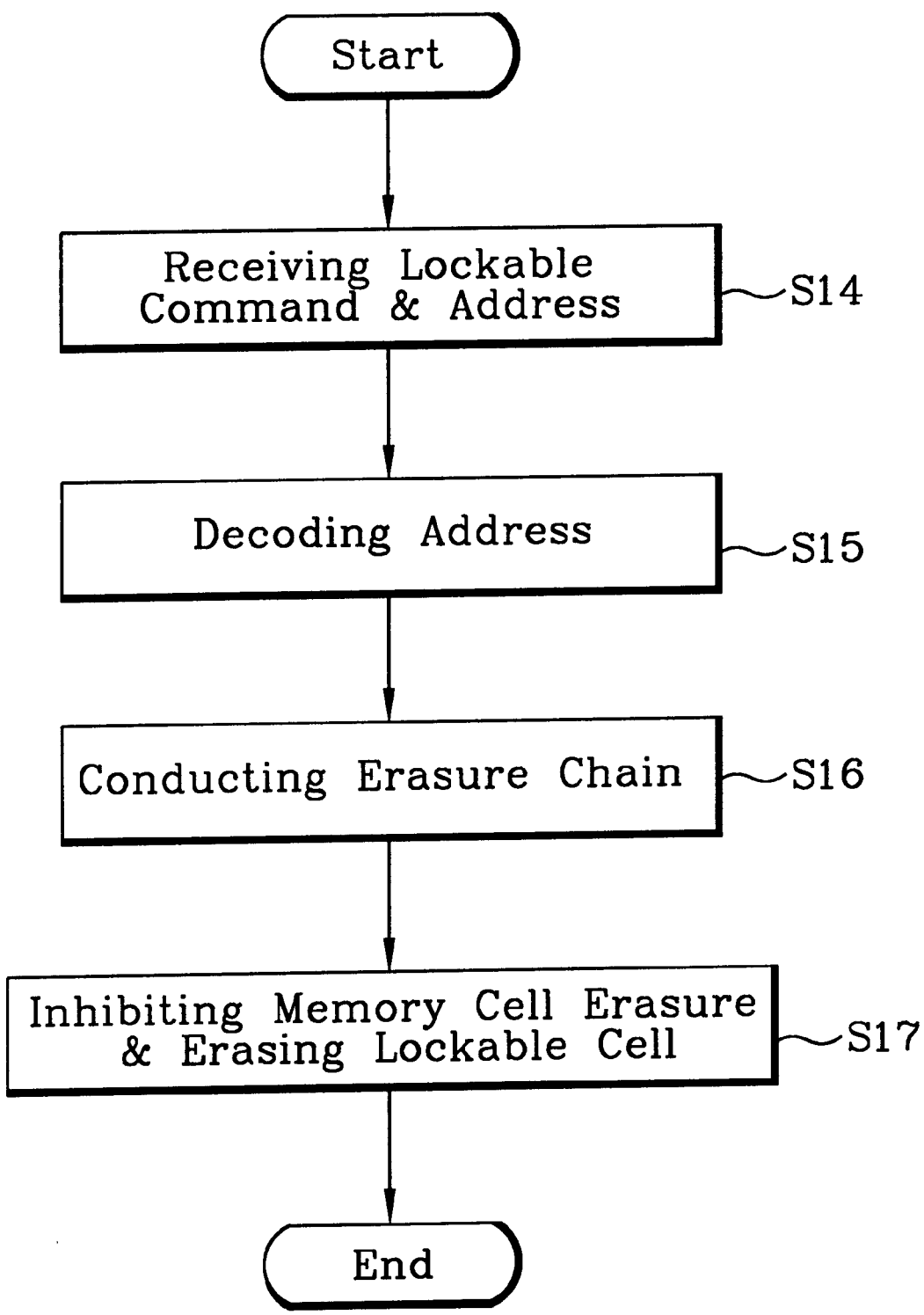
FIG. 6 is a flow chart showing a sequence of converting a locked cell of a selected page to an unlocked cell by erasing.
Figure 7:
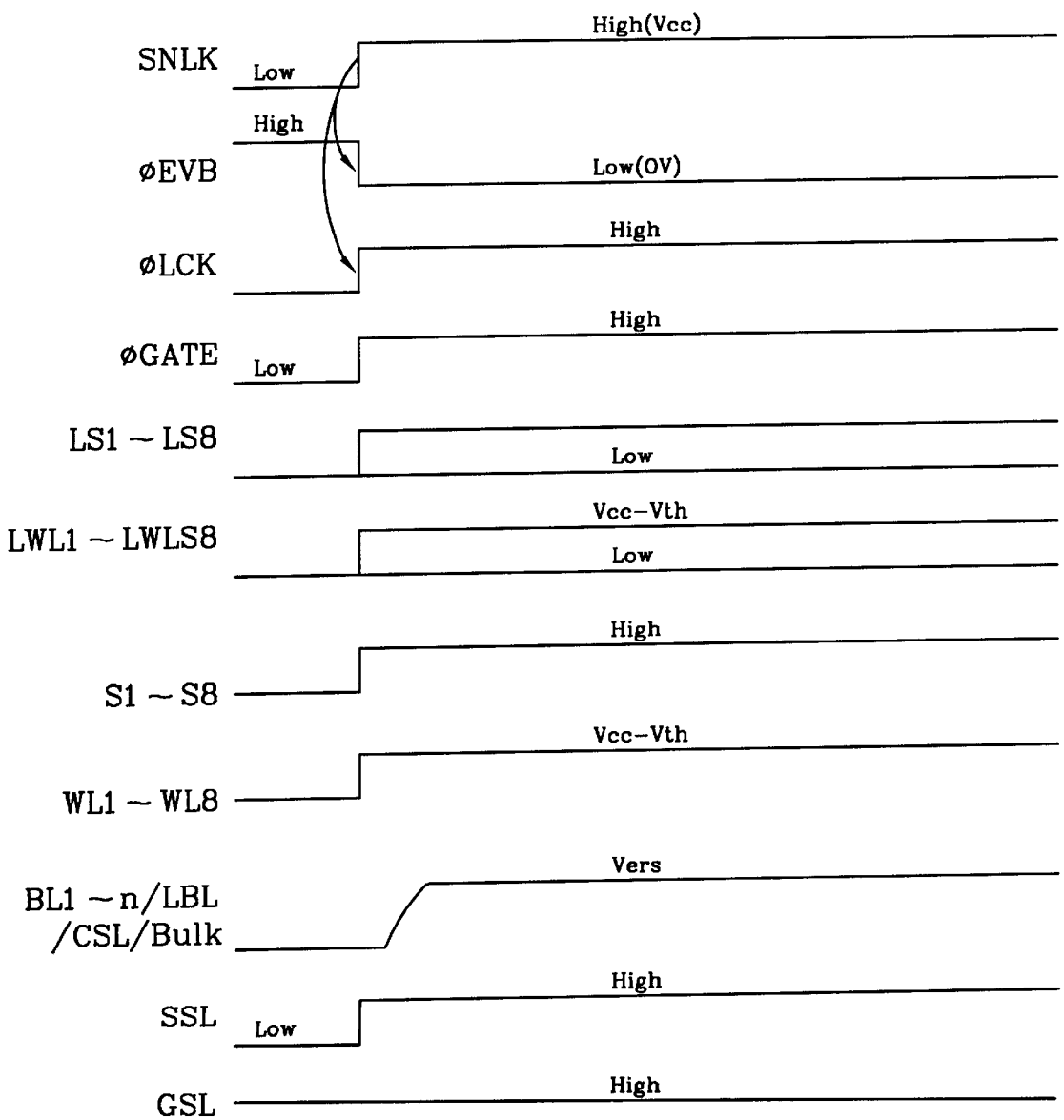
FIG. 7 is a timing diagram of erasing a locked cell according to the sequence of FIG. 6.

FIG. 6 is a flow chart showing a sequence of converting a locked cell of a selected page to an unlocked cell by erasing. FIG. 7 is a timing diagram of erasing a locked cell according to the sequence of FIG. 6. As shown in FIGS. 6 and 7, in an erasing mode for making a lockable cell set into the state of the erasure unlock, the command signal FA and address signals $A_0$ to $A_n$ are supplied from the input/output buffer 26 and the address buffer 20 (step S14). Afterwards, the address is decoded into the information for selecting a block and a page to be unlocked (S15). Since the command signal is for the erasure unlock, the command register 29 pulls the lock flag signal SNLK up to a high level as shown in FIG. 5, causing the erasure/program control circuit 30 to activate its erasure chain (S16). Then, an erasure voltage $V_{ers}$ of about 20V is generated in response to the erasure voltage drive signal ΦEVB being at a low level and is applied to the memory sub-decoder 22 and the lockable sub-decoder 24.

Next, the erasing of a lockable cell begins at step S17. FIG. 7 illustrates the sequential flow in step S17. As shown in FIGS. 2, 3 and 7, the lockable control signal ΦLCK rises to high level by the unlock flag signal SNLK being at a high level, pulled up to the level of power source voltage the sub-decoding signals $S_1$ to $S_8$, used for selecting pages of memory cell array 17 be forced to be pulled up to the level of power source voltage. This allows one of the sub-decoding signals $LS_1$ to $LS_8$, used for selecting pages of lockable cell array 18, to be at the ground level. Assuming that $LS_8$ is selected for this, the other sub-decoding signals $LS_1$ to $LS_7$ have the level of the power source voltage, i.e., a high level, while $LS_8$ is at the ground level, i.e., 0V or a low level. While this is being done, the block gating signals ΦGATE is positioned to a high level and is applied to the gates of lockable pass transistors $MLP_1$ to $MLP_8$ as well as to the gates of memory pass transistors $MP_1$ to $MP_{10}$. Because $S_1$ to $S_8$ are set into a high level, i.e., $V_{cc}$, the memory word lines $WL_1$ to $WL_8$ have the voltage level of $V_{cc}-V_{th1}$ (where $V_{th1}$ is the threshold voltage of a memory pass transistor). However, the lockable word lines $LWL_1$ to $LWL_8$ are subjected to the states of $LS_1$ to $LS_8$. For example, if the lockable cell $MLC_8$ is selected to be unlocked, $LWL_8$ is set at 0V while $LWL_1$ to $LWL_7$ are set at $V_{cc}-V_{th2}$ (where, $V_{th2}$ is threshold voltage of a lockable pass transistor). For the erasure against the selected lockable cell $MLC_8$, the string selection line SSL goes to a high level, the ground selection line GSL is held at a high level, and the erasure voltage $V_{ers}$ is provided to all of the bit lines, the common source line CL, and the bulk of the cells.

With respect to the selected lockable cell $MLC_8$, since a low signal, i.e., 0V, is applied to the control gate, and $V_{ers}$ is applied to the bulk, electrons move to the bulk from the floating gate and thus lower the threshold voltage to cause on-cell storing of the information of the erasure unlock.

In this manner, it would be understood that the word lines of the memory cells $MC_1$ to $MC_8$ and the lockable cells $MLC_1$ to $MLC_7$ are held at the level of an erasure inhibition voltage and so the cells are prevented from being erased. As shown in FIG. 7, because of an increase in the voltage of the bulk, the memory word lines $WL_1$ to $WL_8$ and the unselected lockable word lines $LWL_1$ to $LWL_7$ meet with a erasure inhibition voltage by means of capacitive coupling between them and the bulk, rising from the initial voltage level of $V_{cc}-V_{th1}$ or $V_{cc}-V_{th2}$.

Figure 8:
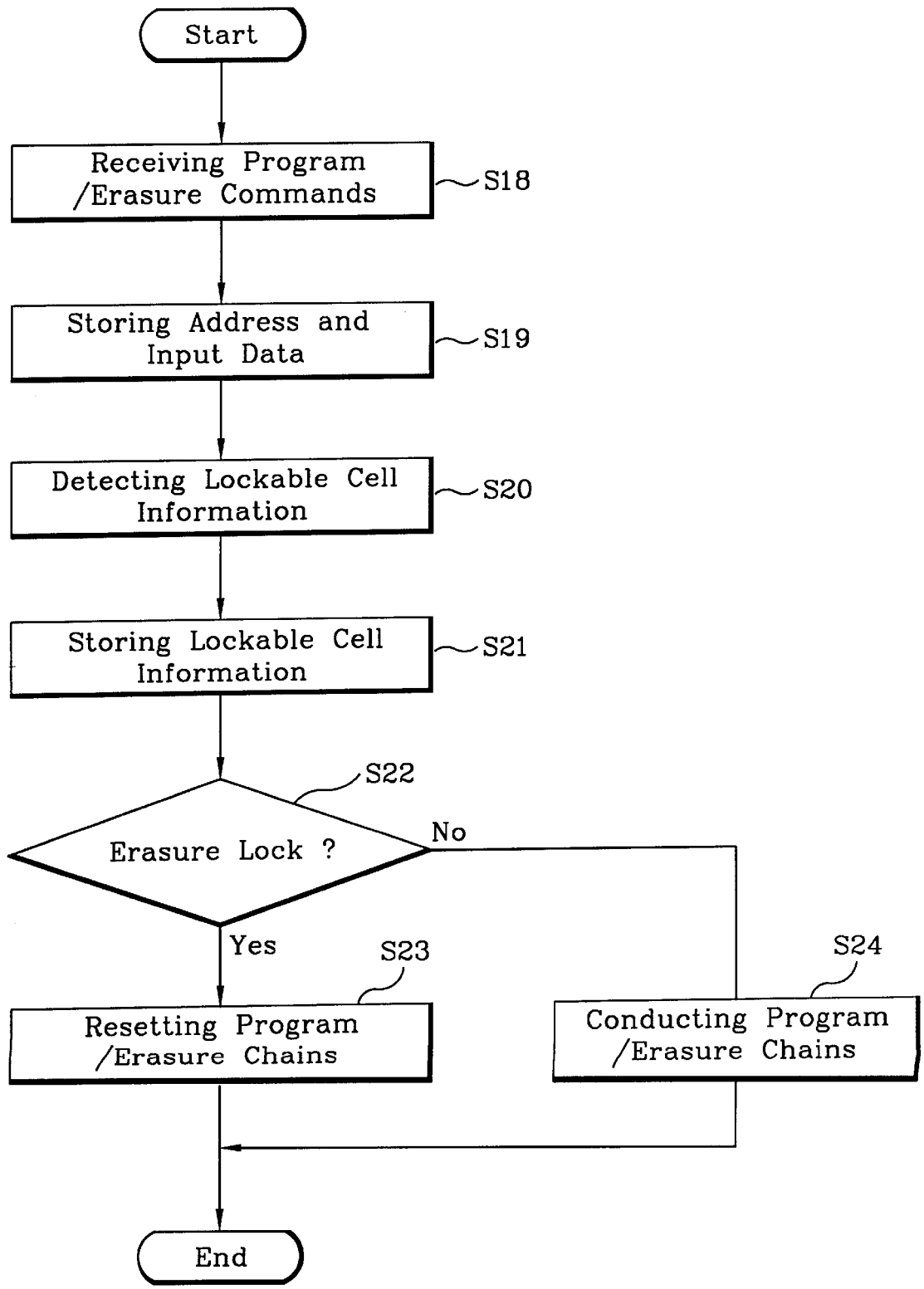
FIG. 8 is a flow chart of erasing and programming a memory cell in a selected page, responding to information for a lockable cell of the selected page.

An alternative operation for the memory in accordance with the information from the lockable cells will be described below, with reference to FIG. 8. When a command signal for a program or an erasure is applied to the command register 29 (S18), the program flag signal SPGM or the erasure flag signal SERS are activated from the command register 29. Then, a page to be programmed or erased is selected by an address and data received through input/ output buffer 26 is stored in the subsidiary storage circuit 35 (S19) for the purpose of conserving data of the selected page when the information of the erasure lock is detected from the lockable cell array involved in the selected page. Next, a read operation from a lockable cell involved in the selected page is conducted to determine whether or not the lockable cell has the information of the erasure lock (S20). Such read operation for the lockable cell is the same with a normal reading in a NAND-typed nonvolatile memory. In other words, 0V and a read voltage (about 4.5V) are respectively applied to a selected word line (selected memory and lockable word lines) and unselected word lines (unselected memory and lockable word lines). The data read out from the page is stored in the page buffer circuitry 28, in which data from memory cells of the page is stored in memory page buffers 28a, and data from a lockable cell of the page in lockable page buffer 28b (S21). Thereafter, the data in the lockable page buffer 28b is transferred to the lock detection circuit 34 through the lockable column gates 27b. The lock detection circuit 34 detects whether or not the selected page is set into the erasure lock state (S22).

If the information from the selected lockable cell is detected to be in the erasure locking state, a lock information signal LCK of high level is generated by the lock detection circuit 34. The activated LCK signal resets the erasure and program chains in the erasure/program control circuit 30 (S23), so that the page in the state of the erasure lock does not erase and program operations. In this way the data of the page is maintained. On the other hand, if the page selected is detected to be unlocked, the LCK signal goes to a low level and allows the program and erasure operations against the selected page to be conducted (S24). During the program and erasure operations, the lockable word lines $LWL_1$ to $LWL_8$ are held at the ground level (0V) and the power source voltage ($V_{cc}$), respectively, which protects the lockable cells in the selected page from the erasure and programming for memory cells of the selected page.

It may be possible that the capacity of storing the information for the erasure lock can be expanded by means of controlling the output of the lockable decoding means.

As described above, the invention has an advantage that it is easy to control the erasure lock operation because the lockable cell array is independent of the memory cell array. Furthermore, it can be easily interchanged between the states of the erasure lock and unlock without disturbing data of memory cells even after a program operation for the memory cells has been finished.

While the present invention has been particularly shown and disclosed with reference to the preferred embodiment thereof, it will be appreciable that other embodiments and modification of the invention are possible.

What is claimed is:

1. A semiconductor memory, comprising:
    a memory cell array comprising a plurality of memory cells coupled to a plurality of memory word lines and bit lines;
    a lockable cell array comprising a plurality of lockable cells that are coupled to a lockable bit line and a plurality of lockable word lines;
    a lockable decoding circuit for generating a plurality of decoding signals to select the lockable word lines, independent from selection of the memory word lines,
    wherein the lockable word lines are electrically isolated from the memory word lines.

2. A semiconductor memory, as recited in claim 1, wherein the memory cell array comprises a plurality of blocks and the plurality of the blocks comprise a plurality of pages.

* * * * *